(12) United States Patent
Yurino

(10) Patent No.: US 8,791,555 B2
(45) Date of Patent: Jul. 29, 2014

(54) SEMICONDUCTOR DEVICE AND LEAD FRAME

(75) Inventor: Takahiro Yurino, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/025,753

(22) Filed: Feb. 11, 2011

(65) Prior Publication Data

US 2011/0233738 A1  Sep. 29, 2011

(30) Foreign Application Priority Data

Mar. 29, 2010  (JP) ................................. 2010-076324

(51) Int. Cl.
*H01L 23/495* (2006.01)

(52) U.S. Cl.
USPC .... 257/670; 257/676; 257/666; 257/E23.031; 257/E23.037

(58) Field of Classification Search
USPC ........... 257/676, 666, 670, E23.031, E23.037
See application file for complete search history.

(56) References Cited

U.S. PATENT DOCUMENTS

| 5,182,630 A * | 1/1993 | Omi et al. ..................... 257/787 |
| 2002/0017706 A1* | 2/2002 | Sone ............................. 257/676 |

FOREIGN PATENT DOCUMENTS

| JP | 58-070562 A | 4/1983 |
| JP | 4-134853 A | 5/1992 |
| JP | 06-045496 A | 2/1994 |
| JP | 7-007124 A | 1/1995 |
| JP | 8-162596 A | 6/1996 |
| JP | 9-153586 A | 6/1997 |
| JP | 10-270627 A | 10/1998 |
| JP | 2000-286374 A | 10/2000 |
| JP | 2004-096134 A | 3/2004 |
| WO | 98/29903 A1 | 7/1998 |

OTHER PUBLICATIONS

Japanese Office Action dated Sep. 3, 2013, issued in corresponding Japanese Patent Application No. 2010-076324, with Partial English translation (3 pages).

* cited by examiner

*Primary Examiner* — Luan C Thai
(74) *Attorney, Agent, or Firm* — Westerman, Hattori, Daniels & Adrian, LLP

(57) ABSTRACT

A semiconductor device including a semiconductor element, a die pad of a plane size smaller than that of the semiconductor element, a plurality of hanging leads extending from the die pad, and sealing resin for covering the semiconductor element, the die pad, and the hanging leads. The width of a first main surface of each hanging lead, integrated with the mounting surface of the die pad, is smaller than the width of a second main surface thereof, integrated with the opposite surface of the die pad.

14 Claims, 13 Drawing Sheets

SEMICONDUCTOR DEVICE AND LEAD FRAME

CROSS-REFERENCE TO RELATED APPLICATION

This application is based upon and claims the benefit of priority of the prior Japanese Patent Application No. 2010-76324, filed on Mar. 29, 2010 the entire contents of which are incorporated herein by reference.

FIELD

The present invention relates to a semiconductor device having a resin-sealed structure and a lead frame applied to the semiconductor device.

BACKGROUND

A resin-sealed semiconductor device is known, in which a semiconductor element (semiconductor chip) is mounted over and fixed to a die pad (die stage) of a lead frame with die-attaching material (die-bonding material), in which electrode terminals of the semiconductor element and inner leads of the lead frame are connected to each other with bonding wires, and in which sealing resin covers the semiconductor element, the bonding wires, the die pad, and the inner leads.

In such a resin-sealed semiconductor device, various types of lead frames are applied depending on type and outside size of a semiconductor element, and the external connection terminal (outer lead) leading structure and arrangement in lead frames.

As an example of a lead frame, a lead frame having an average die-pad structure is known, which has a die pad of a plane size larger than the plane outside size of the semiconductor element to be mounted (for example, see Japanese Laid-open Patent Publication No. 04-134853).

On the other had, a lead frame having a small die-pad structure is also known, in which a die pad of a plane size smaller than the plane outside size of the mounted semiconductor element is supported by hanging leads (for example, see Japanese Laid-open Patent Publication No. 07-7124).

In a semiconductor device having a lead frame of the average die-pad structure, separation is likely to occur between the die pad and the die-attaching material, or between the die pad and the sealing resin, depending on the heat conditions for test or mounting.

It is said that the separation is caused by a decrease in the adherence between structural members based on material differences among the die pad, the die-attaching material, and the sealing resin, or based on the contact area between the die pad and the die-attaching material and based on the contact area between the die pad and the sealing resin.

On the other hand, with a lead frame having a structure in which a smaller die pad is employed (hereinafter, small die-pad structure), the smaller die pad provides a smaller contact area with the die-attaching material and a smaller contact area with the sealing resin, thereby increasing the contact area between the sealing resin and the semiconductor element, which has a relatively good adherence.

Therefore, the separation which would occur with the average die-pad structured lead frame is effectively prevented.

However, even with the small die-pad structure, cracks are likely to occur in the sealing resin of the semiconductor device, depending on the size of the small die pad and the resin thicknesses on the bottom surface thereof.

FIG. 10 and FIGS. 11A to 11C illustrate a semiconductor device 500 as an example of the resin-sealed semiconductor device having such a small die-pad structure.

In FIG. 10, the semiconductor device 500 is transparently viewed from the die pad (die stage) side, in which the sealing resin is partially removed for convenience. FIG. 11A is a cross-sectional view taken along the line X5-X5 in FIG. 10. FIG. 11B is a cross-sectional view taken along the line Y5-Y5 in FIG. 10. FIG. 11C is a cross-sectional view taken along the line Z5-Z5 in FIG. 10

In the semiconductor device 500, a semiconductor element (semiconductor chip) 31 is mounted over a die pad (die stage) 11 with die-attaching material (die-bonding material) 21. A plurality of electrode terminals 32 of the semiconductor element 31 are connected to inner leads 13a of lead terminals 13 through bonding wires 41. Four hanging leads 12 extend from the die pad 11.

The die pad 11, the semiconductor element 31, the bonding wires 41, the inner leads 13a of the lead terminals 13 and the hanging leads 12 are covered with sealing resin 51.

The outer leads 13b of the lead terminals 13 function as a terminal for external connection of the semiconductor device 500.

In the semiconductor device 500, each of the four hanging leads 12 has a relatively large width (width W7), extending from the die pad 11 orthogonally to each other.

In the semiconductor device 500, if the semiconductor element 31 is not mounted in parallel with the die pad 11, or if the die pad 11 becomes deformed (uneven) in resin-sealing process, the hanging leads 12 make contact with the semiconductor element 31. FIG. 11B illustrates such a state.

As indicated by the circle 61, the semiconductor element 31 is in contact with one of the hanging leads 12.

If such a contact portion appears, since each hanging lead 12 has a large width, the contact area between the hanging lead 12 and the semiconductor element 31 is relatively large. Near the contact portion, there is a portion which is left unfilled with the sealing resin 51.

In this case, the moisture contained in the sealing resin 51 concentrates in such an unfilled portion, and the adherence of the semiconductor element 31 and the hanging lead 12 with the sealing resin 51 therebetween decreases.

Therefore, separation occurs between the semiconductor element 31 and the hanging lead 12 near the contact portion if the semiconductor device 500 is left under high temperature conditions for remelting (reflowing) solder material in order to mount the semiconductor device 500 over a wiring board (motherboard) for an electronic device.

Specifically, since the semiconductor device 500 has been left under high temperature conditions, the moisture content therein expands, the poor contact between the semiconductor element 31 and the hanging lead 12 is further disrupted, thereby causing separation in a wide range. In FIG. 10, the portions 61 represent the separations.

If the solder material applied for mounting the semiconductor device 500 over a wiring board (motherboard) is Pb-free solder, which needs high temperature to remelt (reflow), the expanded moisture further expands the gap between the semiconductor element 31 and the hanging lead 12, thereby causing separation more easily in a wider range.

On the other hand, FIG. 12 and FIGS. 13A to 13C illustrate a semiconductor device 600 as an example of a resin-sealed semiconductor device having the small die-pad structure, together with a lead frame having narrow hanging leads.

In FIG. 12, the semiconductor device 600 is transparently viewed from the die pad (die stage) side, in which the sealing resin is partially removed for convenience. FIG. 13A is a cross-sectional view taken along the line X6-X6 in FIG. 12. FIG. 13B is a cross-sectional view taken along the line Y6-Y6 in FIG. 12. FIG. 13C is a cross-sectional view taken along the line Z6-Z6 in FIG. 12.

Also in the semiconductor device 600, a semiconductor element (semiconductor chip) 31 is mounted over and fixed to a die pad 11 of a lead frame with die-attaching material (die-bonding material) 21. A plurality of electrode terminals 32 of the semiconductor element 31 are connected to inner leads 13a of lead terminals 13 through bonding wires 41. Four hanging leads 12 extend from the die pad 11.

The die pad 11, the semiconductor element 31, the bonding wires 41, the inner leads 13a of the lead terminals 13, and the hanging leads 12 are covered with sealing resin 51.

The outer leads 13b of the lead terminals 13 function as a terminal for external connection of the semiconductor device 600.

In the semiconductor device 600, each of the four hanging leads 12 extending from the die pad 11 orthogonally to each other, has a width (width W8) smaller than the hanging leads 12 of the semiconductor device 500.

The narrow hanging lead 12 provides a small contact area with the semiconductor element 31. Even if there is any portion which is left unfilled with the sealing resin 51 near the contact portion, the volume of the portion is very small (not illustrated).

Therefore, even if the moisture content in the sealing resin 51 expands, the force expanding the gap between each hanging lead terminal 13 and the semiconductor element 31 is smaller, compared to the case of the semiconductor device 500.

Therefore, the intimate contact between the semiconductor element 31 and the sealing resin 51 is maintained near the contact interface, thereby preventing separation in a wide range.

However, in this structure, cracks are likely to occur in the sealing resin 51 on the margin of the die pad 11 after heat cycle test.

FIG. 13A illustrates such a state. In FIG. 13A, a portion 71 represents a crack which has occurred in the sealing resin 51.

When the semiconductor device 600 is heated or cooled, the sealing resin 51 is thermally expanded or shrank, which produces a thermal stress. A crack occurs by the thermal stress concentrating on the center of the semiconductor device.

When the thermal stress becomes as large as the shearing stress of the sealing resin 51, the crack 71 occurs in the sealing resin 51 from near the die pad 11 in the center of the semiconductor device 600.

The handing leads 12 of wider width contribute to the dispersion of the thermal stress. However, if the hanging lead 12 is narrow in width, the dispersion is not achieved effectively. In this case, it is difficult to prevent or reduce the concentration of the thermal stress.

As a result, the crack 71 is likely to occur in the sealing resin 51.

As has been described above, in the resin-sealed semiconductor device having the small die-pad structure, the separation between the sealing resin and each hanging lead, which is likely to occur in the average die-pad structure, is prevented or reduced.

However, even in the small die-pad structured semiconductor device, the thermal stress produced when a heat cycle test is conducted is not absorbed, so that a crack is likely to occur in the sealing resin near the die pad.

SUMMARY

According to an aspect of the present invention, there is provided a semiconductor device which includes: a semiconductor element; a lead frame that includes a die pad having a mounting surface over which the semiconductor element is mounted, and a plurality of hanging leads extending from the die pad, the die pad having a plane size smaller than the semiconductor element; and resin for sealing the semiconductor element, the die pad, and the hanging lead, wherein a width of a first surface of the hanging lead integrated with the mounting surface of the die pad is smaller than a width of a second surface of the hanging lead which is opposite to the first surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of the present invention will be described with reference to the accompanying drawings.
(First Embodiment)

Figure 1:
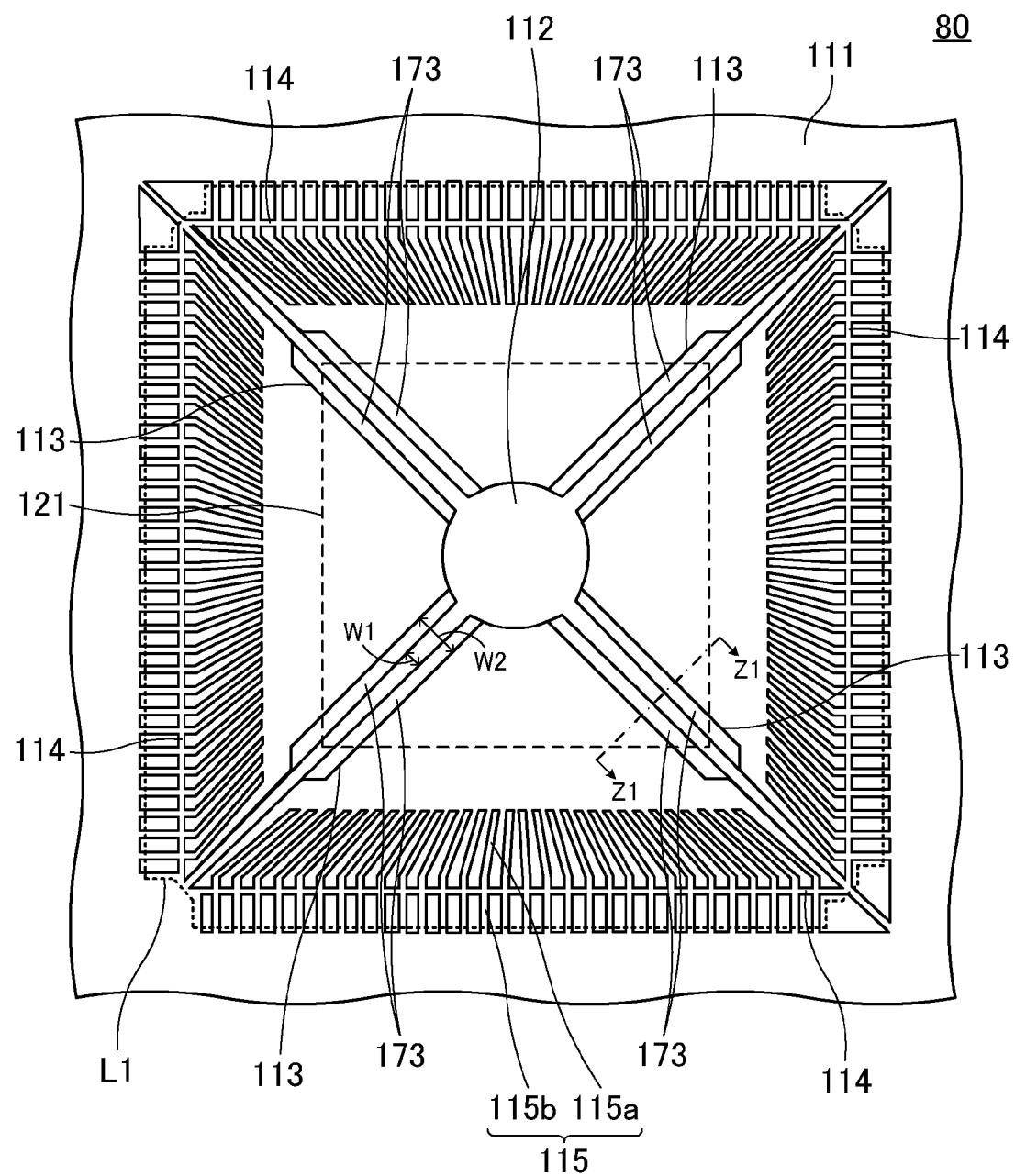
FIG. 1 is a top view schematically illustrating the structure of a lead frame according to a first embodiment.

FIG. 1 illustrates a lead frame 80 according to a first embodiment.

The lead frame 80 illustrated in FIG. 1 is formed by pressing a metal plate made of copper (Cu).

In FIG. 1, the lead frame 80 is viewed from the main side thereof where a semiconductor element is to be mounted or fixed.

The lead frame 80 is employed for one resin-sealed semiconductor device.

The lead frame 80 has a frame portion 111 which has lead frames for other semiconductor devices (not illustrated).

The lead frame 80 includes a die pad (die stage) 112 and four hanging leads 113 which extend in different directions from the die pad 112.

The lead frame 80 further includes a plurality of lead terminals 115. The lead terminals 115 are arranged substantially on the same plane, between the hanging leads 113. The lead terminals 115 are interconnected by dam bars (tie bars) 114.

The die pad 112 has a circular plane shape. The plane outside size of the die pad 112 is smaller than the outside size of a rectangular semiconductor element 121 indicated by dashed lines in FIG. 1.

The four hanging leads 113 extend generally toward the four corners of the semiconductor element 121, orthogonally to each other, on a plane parallel to the main surface of the die pad 112.

Each hanging lead 113 has a first portion and a second portion. The first portion shares the same plane in a length direction thereof with the top surface of the die pad 112, that is, the mounting surface thereof. The first portion has a width of W1. The second portion shares the same plane with the bottom surface (rear side) of the die pad 112. The second portion has a width of W2, being wider than the first portion.

Specifically, the first portion is supposed to face the rear side of the semiconductor element 121.

Across each dam bar (tie bar) 114, each lead terminal 115 has an inner lead 115a positioned close to the die pad 112 and an outer lead 115b positioned closer to the frame portion 111.

Each dam bar 114 reaches the extended portions of the corresponding hanging leads 113 so as to integrate together.

In a process of manufacturing a resin-sealed semiconductor device including the lead frame 80, first, the semiconductor element 121 is mounted over and fixed to the die pad 112 with die-attaching material (die-bonding material, not illustrated) such as silver (Ag) paste.

The semiconductor element 121 has a plane outside size larger than the die pad 112.

Each electrode terminal (not illustrated) of the semiconductor element 121 fixed to the die pad 112 is connected to the corresponding inner lead 115a through bonding wire (not illustrated) such as gold (Au) wire.

Next, the semiconductor element 121, the bonding wire, the inner leads 115a, the die pad 112, and the hanging leads 113 are sealed with sealing resin made of epoxy resin (not illustrated). The transfer mold method is employed for resin sealing.

In this case, although the sealing resin is molten, each dam bar 114 prevents the sealing resin from flowing toward the outer leads 115b.

After the resin sealing process, the lead frame 80 is cut out along the dotted line L1 indicated in FIG. 1, that is, between the outer ends of the outer leads 115b of the lead terminals 115 and the frame portion 111, thereby separating the formed semiconductor device from the frame portion 111.

In this case, the dam bars 114 which interconnect adjacent lead terminals 115, and the dam bars 114 extending between the hanging leads 113 and their adjacent lead terminals 115 are also cut out and removed, so that each lead terminal 115 becomes independent.

At the same time, the lead terminals 115 are bent as necessary for finishing adjustment.

A resin-sealed semiconductor device in which the plane shape of the resin-sealed portion is rectangular is thus formed.

In this resin-sealed semiconductor device, the die pad 112 is positioned almost in the center thereof.

Examples of the material of the lead frame 80 include copper (Cu), alloys of copper (Cu), and an alloy of iron (Fe) and nickel (Ni) (42 alloy).

The lead frame 80 may be formed by etching, in addition to pressing.

In either of the methods, a plurality of spaces are prepared on one strip plate in most cases. In each space, a semiconductor device is to be formed.

A semiconductor element is then mounted over and fixed to the die pad (die stage) placed on each space so that a resin-sealed semiconductor device is manufactured.

This embodiment is characterized by the structure of each hanging lead 113 of the lead frame 80, specifically, the cross section of each hanging lead 113.

Figure 2A:
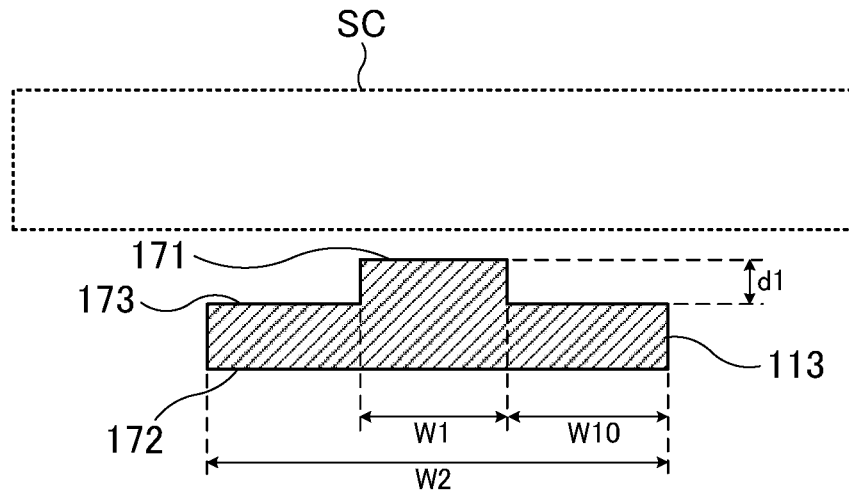
FIGS. 2A to 2C are cross-sectional views schematically illustrating the structure of a hanging lead of the lead frame according to the first embodiment.

FIG. 2A illustrates the cross section of each hanging lead 113 of the lead frame 80 according to the first embodiment.

FIG. 2A is a cross-sectional view taken along the line Z1-Z1 in FIG. 1.

In FIG. 2A, the semiconductor element 121 to be mounted over and fixed to the lead frame 80 is schematically indicated as the rectangle SC.

As illustrated in FIG. 1 and FIG. 2A, the hanging lead 113 has a first portion 171 of a width W1 on the same plane as the top surface of the die pad (die stage) 112, that is, the mounting surface thereof. The hanging lead 113 also has a second portion 172 of a width W2 wider than the first portion 171, on the same plane as the bottom surface (rear side) of the die pad 112.

Specifically, the width W1 of the main surface of the hanging lead 113 integrated with the mounting surface of the die pad 112 is shorter than the width W2 of the opposite main surface (rear side) of the hanging lead 113 integrated with the non-mounting surface of the die pad 112.

The first portion 171 is positioned almost in the center of the hanging lead 113 in a width direction thereof.

Since the width W2 of the second portion 172 is longer than the width W1 of the first portion 171, a lower-level portion (step portion) 173 of a width W10 and a depth (height) d1 is provided on both sides of the first portion 171 in an extending direction of the hanging lead 113.

The lower-level portion 173 is on a level lower than the first portion 171.

Therefore, the first portion 171 formed almost in the center of the hanging lead 113 is as thick as the lead frame 80 except the lower-level portion 173.

In the hanging lead 113, the first portion 171 is set, specifically, the lower-level portion 173 is formed, by pressing again the lead frame 80 which has been formed by pressing or etching.

First, the hanging lead 113 is formed by pressing or etching to have the width W2. Then the formed hanging lead 113 is pressed again on a surface thereof to be integrated with the mounting surface of the die pad 112, thereby forming the lower-level portion 173 and the first portion 171 of width W1.

In order that the width W1 of the main surface (top surface) of the hanging lead 113 integrated with the mounting surface of the die pad 112 is shorter than the width W2 of the opposite rear surface integrated with the non-mounting surface of the die pad 112, chamfering or etching may be employed, in addition to pressing.

First, a metal plate is pressed to form a hanging lead 113 of a predetermined width (for example, width W2) and a rectangular cross section. Then, chamfering is performed on both edges of the top main surface of the hanging lead 113 in an extending direction thereof, thereby forming a linearly slanting portion 174 to be described later.

Chamfering prevents or reduces potential distortion in the hanging lead 113 caused by processing.

Figure 2B:
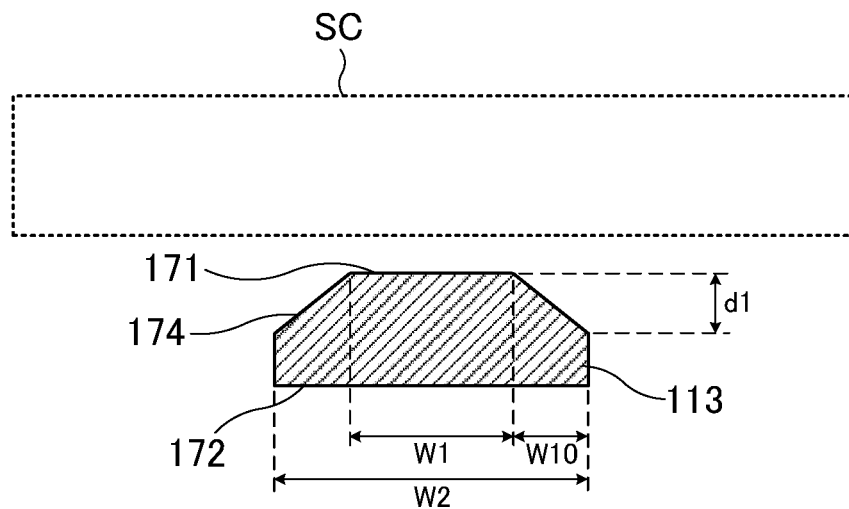

FIG. 2B illustrates the cross section of the hanging lead 113 formed in the chamfering process.

In FIG. 2B, the semiconductor element 121 to be mounted over and fixed to the die pad 112 is schematically indicated as the rectangle SC.

Specifically, the slanting portion 174 linearly extends from both sides of each hanging lead 113 to the top main surface thereof.

Therefore, the width W1 of the top main surface 171 of each hanging lead 113 is smaller than the width W2 of the bottom main surface 172 thererof.

The slanting portion 174 is formed with a depth d1 from the top main surface 171.

In the case of etching, first, a metal plate is pressed to form a hanging lead 113 of a predetermined width (for example, width W2) and a rectangular cross section. Then, etching-mask layers having different widths are placed on both main surfaces of the hanging lead 113.

The width of the etching-mask layer applied on the top main surface of the hanging lead 113 (integrated with the mounting surface of the die pad 112) is shorter than the width of the etching-mask layer applied on the opposite bottom main surface.

Isotropic etching is performed from both main surfaces of the hanging lead 113, thereby forming first and second arcuate slanting portions 175a and 175b on both sides of the hanging lead 113.

Figure 2C:
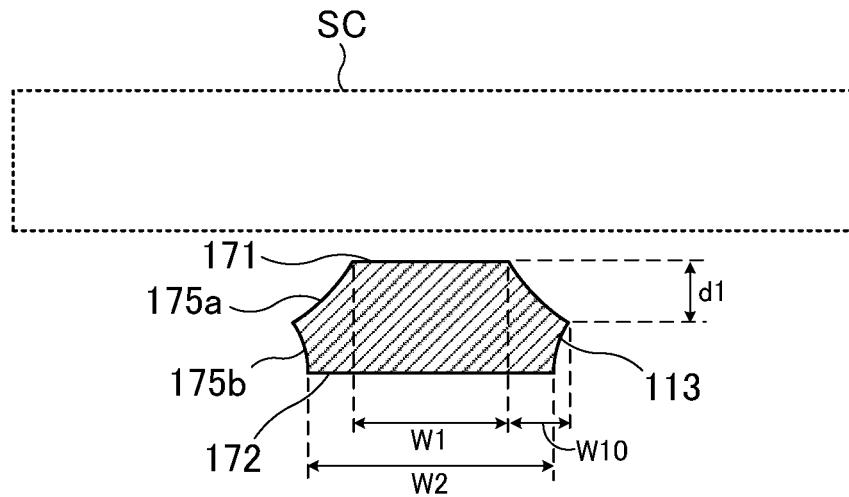

FIG. 2C illustrates the cross section of the hanging lead 113 formed in the etching process.

In FIG. 2C, the semiconductor element 121 to be mounted over and fixed to the die pad 112 is schematically indicated as the rectangle SC.

Specifically, the first slanting portion 175a arcuately extends from both sides of the hanging lead 113 to the top main surface thereof. The second slanting portion 175b arcuately extends from both sides of the hanging lead 113 to the bottom main surface thereof.

The first slanting portion 175a is deeper than the second slanting portion 175b in a thickness direction of the hanging lead 113. The first slanting portion 175a is formed with a depth d1 from the top main surface 171. The width W1 of the top main surface of the hanging lead 113 is shorter than the width W2 of the bottom main surface thereof.

Figure 3A:
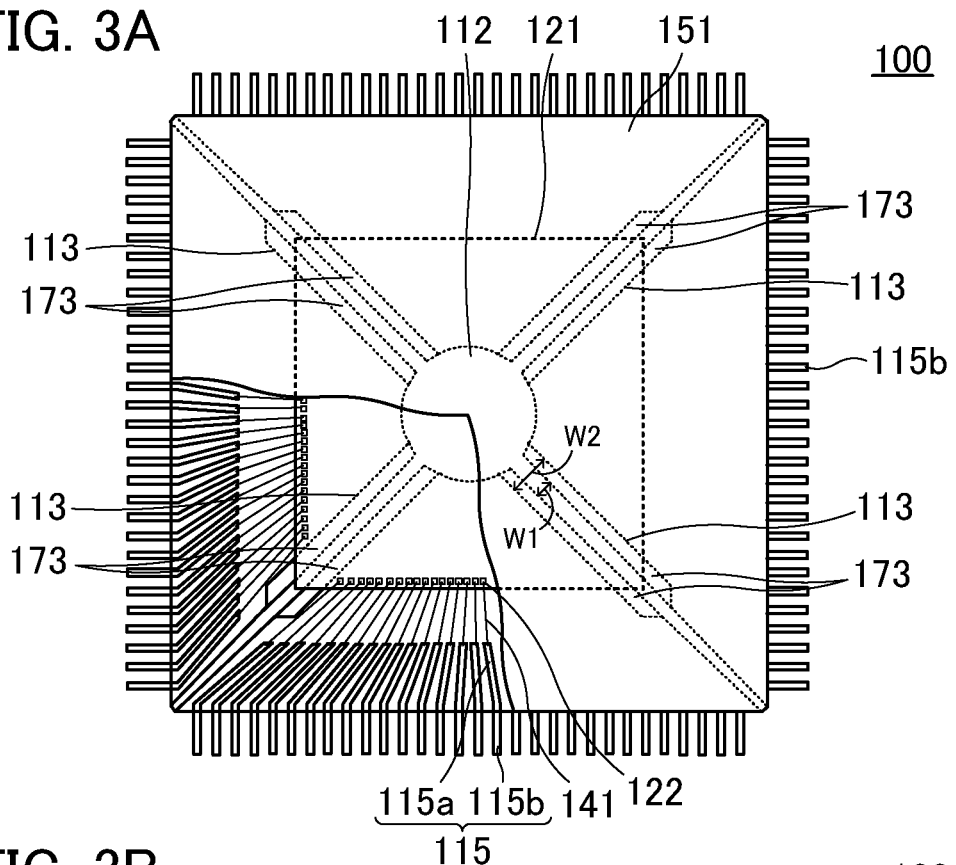
FIGS. 3A and 3B are top views schematically illustrating the structure of a semiconductor device according to the first embodiment.
Figure 3B:
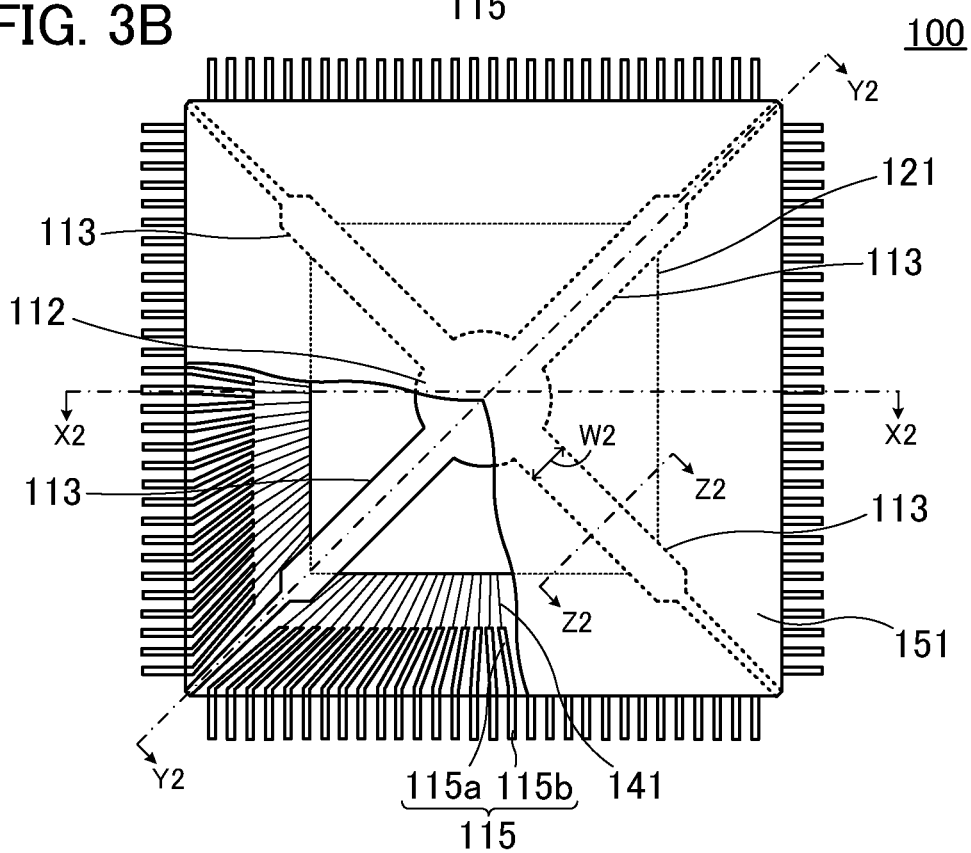

FIGS. 3A and 3B illustrate a semiconductor device 100 formed with the lead frame 80. The hanging lead 113 has the cross section illustrated in FIG. 2A.

In FIG. 3A, the semiconductor device 100 is transparently viewed from a side where the semiconductor element 121 is mounted. In FIG. 3B, the semiconductor device 100 is transparently viewed from a side where the die pad 112 is provided.

In FIGS. 3A and 3B, sealing resin 151 is partially removed for convenience.

Figure 4A:
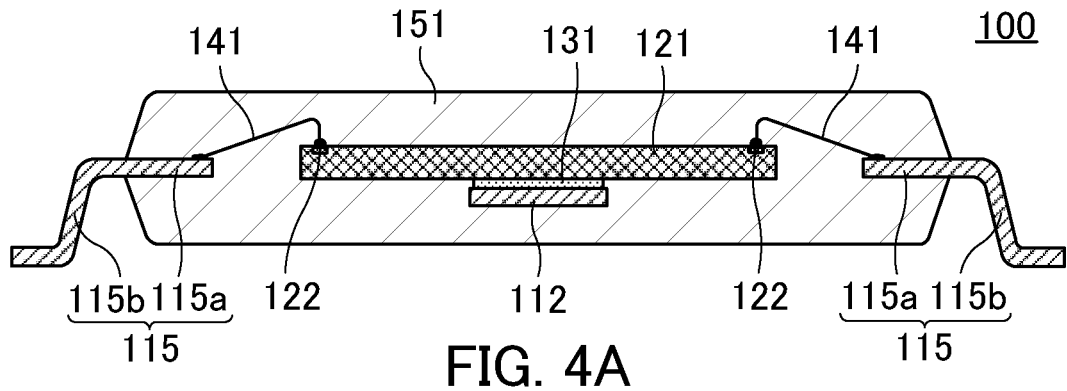
FIGS. 4A to 4C are cross-sectional views schematically illustrating the structure of the semiconductor device according to the first embodiment.
Figure 4B:
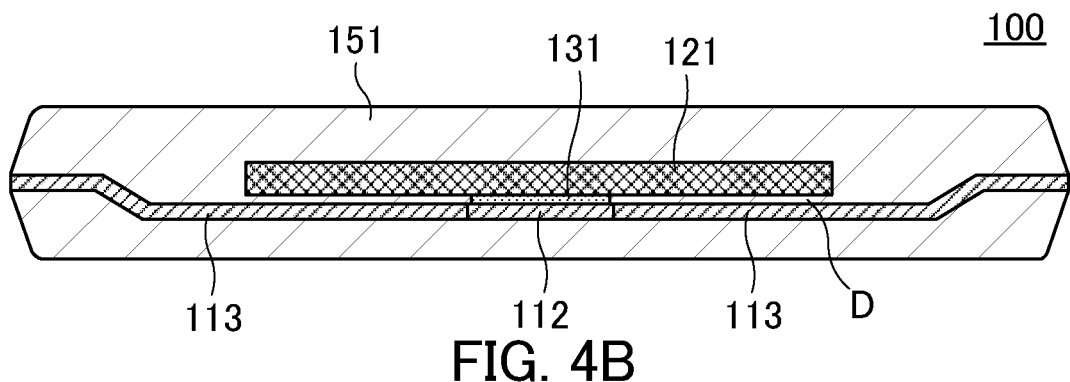
Figure 4C:
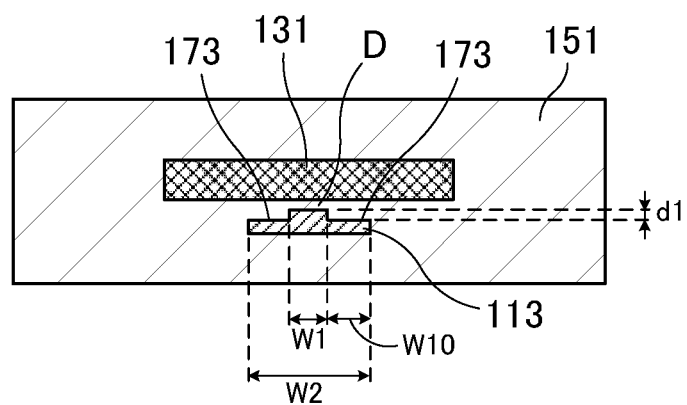

FIG. 4A is a cross-sectional view taken along the line X2-X2 in FIG. 3B. FIG. 4B is a cross-sectional view taken along the line Y2-Y2 in FIG. 3B. FIG. 4C is a cross-sectional view taken along the line Z2-Z2 in FIG. 3B.

Specifically, the semiconductor element 121 is mounted over and fixed to the die pad (die stage) 112 with die-attaching material (die-bonding material) 131. The die pad 112 has a plane size smaller than the plane outside size of the semiconductor element 121 to be mounted thereon.

Each electrode terminal 122 of the semiconductor element 121 is connected to the corresponding inner lead 115a through the corresponding bonding wire 141.

The semiconductor element 121, the bonding wires 141, the die pad 112, the hanging leads 113, and the inner leads 115a are covered with sealing resin 151.

The sealing resin 151 has a rectangular plane outside shape. A plurality of outer leads 115b come out from the four sides of the sealing resin 151. The outer leads 115b function as a terminal for external connection.

In the semiconductor device 100, a clearance D of a thickness generally corresponding to the die-attaching material 131 is created by the die-attaching material 131 on the die pad 112, between the top surface of the hanging lead 113 extending from the die pad 112 and the rear side of the semiconductor element 121.

Since having the larger width W2 on the same plane as the bottom surface (rear side) of the die pad 112, the hanging lead 113 is superior in mechanical strength. As a result, the clearance D therebetween is maintained in an extending direction of the hanging lead 113.

Therefore, since the clearance D between the semiconductor element 121 and the hanging lead 113 is easily filled with the sealing resin 151, almost no portion is left unfilled with the sealing resin 151 in the clearance D.

At the same time, the gap between the lower-level portion 173 of the hanging lead 113 and the rear side of the semiconductor element 121 is also filled with the sealing resin 151.

Specifically, the sealing resin 151 is applied onto the lower-level portion 173 of the hanging lead 113 between the rear side of the semiconductor element 121 and the hanging lead 113, thereby providing a larger contact area between the rear side thereof and the sealing resin 151. As a result, the semiconductor element 121 is firmly integrated with the sealing resin 151.

The size of the lower-level portion 173 (width W10, depth d1) is decided based on the material and the characteristics of the sealing resin 151.

Specifically, the size of the lower-level portion 173 is selected in consideration of the viscosity of the sealing resin 151 and the diameter of filler contained in the sealing resin 151 (particle size) so that the resin component and the filler of the sealing resin 151 enter into the gap between the semiconductor element 121 and the lower-level portion 173 in the resin sealing process.

For example, if the average filler diameter (average particle size) is about 50 μm, the size d1 of the lower-level portion 173 in a depth direction thereof is about 50 μm to 80 μm.

If the depth d1 of the lower-level portion 173 is set in this way for the filler of a predetermined particle size to enter thereinto, the resin component of the sealing resin 151 contacts the rear side of the semiconductor element 121 at least at a thickness equivalent to the particle size of the filler.

This enables the sealing resin 151 and the semiconductor element 121 to be connected firmly to each other, and the hanging lead 113 and the semiconductor element 121 to be fixed firmly to each other.

As long as the depth d1 of the lower-level portion 173 is thus set at a value so that the filler having an average diameter (average particle size) of 50 pm enters thereinto, such an effect is produced.

The size d1 of the lower-level portion 173 in the depth direction thereof is preferably set at about half to one-third of the whole thickness of the hanging lead 113.

In the case where the size d1 is beyond this range, the mechanical strength of the hanging lead 113 decreases, though, it is also influenced by the width W10 of the lower-level portion 173. As a result, the flatness of the die pad 112 decreases, and the hanging lead 113 and the semiconductor element 121 are likely to contact each other in the resin sealing process.

For example, if the thickness of the hanging lead 113 having the lower-level portion 173 is 125 μm, the hanging lead 113 may have the following dimensions: top main surface width W1: 500 μm, bottom main surface width W2: 1600 μm, lower-level portion width W10: 450 μm, and lower-level portion depth d1: 60 μm.

The effect produced by the lower-level portion 173 is produced also in the hanging lead 113 having the slanting portion 174 in FIG. 2B, or in the hanging lead 113 having the first and second slanting portions 175a and 175b in FIG. 2C.

Specifically, since having the larger width W2, the hanging lead 113 is superior in mechanical strength.

As a result, the clearance D between the hanging lead 113 and the semiconductor element 121 is maintained in an extending direction of the hanging lead 113.

Therefore, since the clearance D between the semiconductor element 121 and the hanging lead 113 is easily filled with the sealing resin 151, almost no portion is left unfilled with the sealing resin 151 in the clearance D.

Figure 5A:
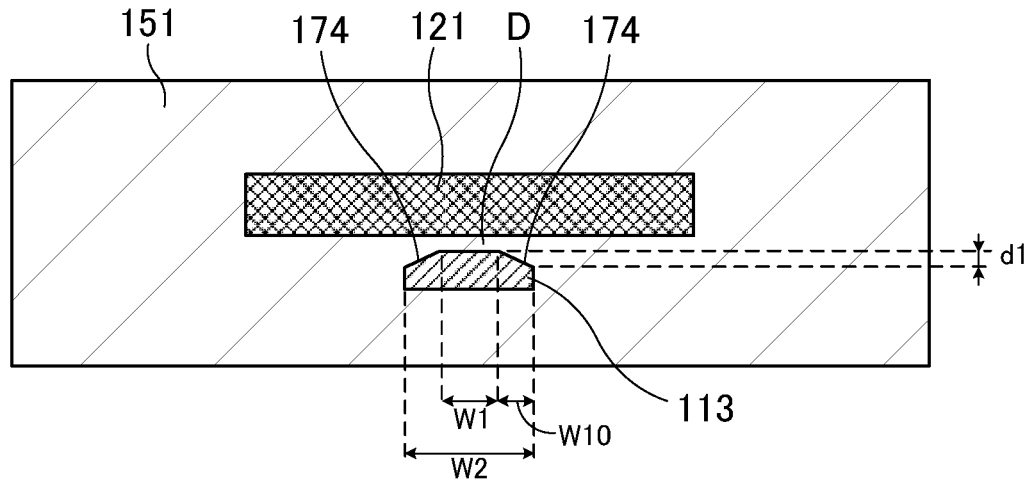
FIGS. 5A and 5B are cross-sectional views schematically illustrating another example of the structure of the semiconductor device according to the first embodiment.
Figure 5B:
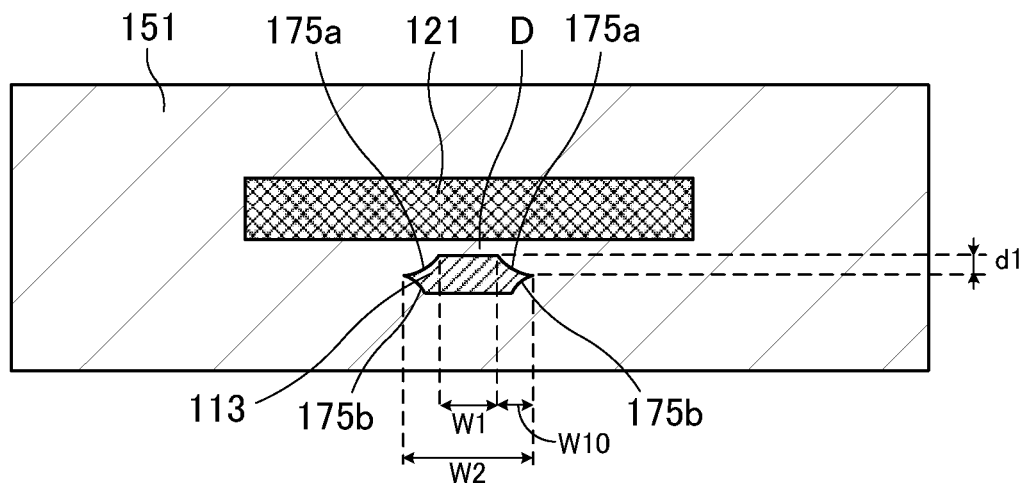

At the same time, the gap between either the slanting portion 174 or the slanting portion. 175a of the hanging lead 113 and the rear side of the semiconductor element 121 is also filled with the sealing resin 151, as illustrated in FIGS. 5A and 5B.

Specifically, the sealing resin 151 is applied onto either the slanting portion 174 or the slanting portion 175a of the hanging lead 113 between the rear side of the semiconductor element 121 and the hanging lead 113, thereby providing a larger contact area between the rear side thereof and the sealing resin 151.

As a result, the semiconductor element 121 is firmly integrated with the sealing resin 151.

The form of the slanting portion 174 or the forms of the slanting portions 175a and 175b (inclination, curvature, etc.) are decided based on the material and the characteristics of the sealing resin 151.

When the slanting portion 174 or the slanting portions 175a and 175b are formed, the size d1 in the depth direction thereof is preferably set at about half to two-thirds of the whole thickness of the hanging lead 113.

In the case where the size d1 is beyond this range, the mechanical strength of the hanging lead 113 decreases, though, it is also influenced by the width W10 of the slanting portion 174 or 175a. As a result, in the resin sealing process, the instability of the die pad 112 is likely to occur, and the hanging lead 113 and the semiconductor element 121 are likely to contact each other.

For example, if the thickness of the hanging lead 113 having the linearly slanting portion 174 is 125 μm, the hanging lead 113 may have the following dimensions: top main surface width W1: 600 μm, bottom main surface width W2: 1300 μm, slanting portion width W10: 350 μm, and depth d1: 80 μm.

On the other hand, for example, if the thickness of the hanging lead 113 having the arcuately slanting portions 175a and 175b is 125 μm, the hanging lead 113 may have the following dimensions: top main surface width 600 μm, bottom main surface width W2: 1000 μm, arcuately slanting portion width W10: 200 μm, and arcuately slanting portion depth d1: 80 μm.

As has been described above, in the semiconductor device 100 according to this embodiment, the width W1 of the main surface of the hanging lead 113 integrated with the top mounting surface of the die pad (die stage) 112 is smaller than the width W2 of the opposite rear surface integrated with the non-mounting surface of the die pad 112.

Having the main surface of width W1 face the semiconductor element 121, the hanging lead 114, even contacted with the semiconductor element 121, allows a very limited contact area.

Therefore, even if the moisture content in the sealing resin 151 is vaporized by heat application, the force expanding the contact interface between each hanging lead 113 and the semiconductor element 121 is suppressed, thereby preventing or suppressing the occurance and expansion of the separation between the semiconductor element 121 and the sealing resin 151.

Specifically, in addition that the contact area becomes smaller, the separation is effectively prevented or suppressed by the firm covering by the sealing resin 151 except the contact area.

On the other hand, since the rear surface of the hanging lead 113 integrated with the non-mounting surface of the die pad 112 has the large width W2, the thermal stress in the sealing resin 151 is dispersed.

This prevents the stress from concentrating on the margin of the die pad 112, thereby preventing or suppressing the cracks which are likely to occur on the margin thereof in the sealing resin 151.

Specifically, in this embodiment, the separation between the semiconductor element 121 and the sealing resin 151, and the crack occurance in the sealing resin 151 are prevented or suppressed effectively, thereby achieving a highly reliable resin-sealed semiconductor device.

In addition, each hanging lead 113 has almost the same thickness as the die pad 112 in the center of the hanging lead 113 in a width direction thereof. Therefore, the mechanical strength thereof is maintained.

Furthermore, the hanging leads 113 extend generally toward the four corners of the semiconductor element 121, orthogonally to each other, on a plane parallel to the main surface of the die pad 112. Therefore, the die pad 112 and the semiconductor element 121 placed on the die pad 112 are properly supported, without being slanted.

According to this embodiment, as illustrated in the FIGS. 4A to 4C, in the semiconductor device 100, the level of the top surface of the die pad 112, specifically, the level of the mounting surface thereof is lower than the top surface of each inner lead 115a, specifically, the level of the surface to which each bonding wire 141 is connected.

This structure is formed by bending (downsetting) a lead frame and then curving the hanging leads 113.

This bending (downsetting) process enables the top surface of the semiconductor element 121 placed on the die pad 112 to be almost at the same level as the top surface of the inner leads 115a.

Therefore, when each electrode terminal 122 of the semiconductor element 121 and each inner lead 115a are connected with the bonding wire 141, the connection reliability thereof is improved.

Also, since the level of the top surface of the die pad 112 is lower than the level of the top surface of each inner lead 115a, the semiconductor element 121 placed on the die pad 112 is positioned almost in the center of the cavity space within the mold for resin sealing in a height direction thereof.

Therefore, the sealing resin 151 injected into the cavity flows both on the top surface of the semiconductor element 121 and on the bottom surface thereof almost at the same speed, and the void occurrence in the sealing resin and the deformation of the die pad are prevented or reduced.

(Second Embodiment)

Figure 6:
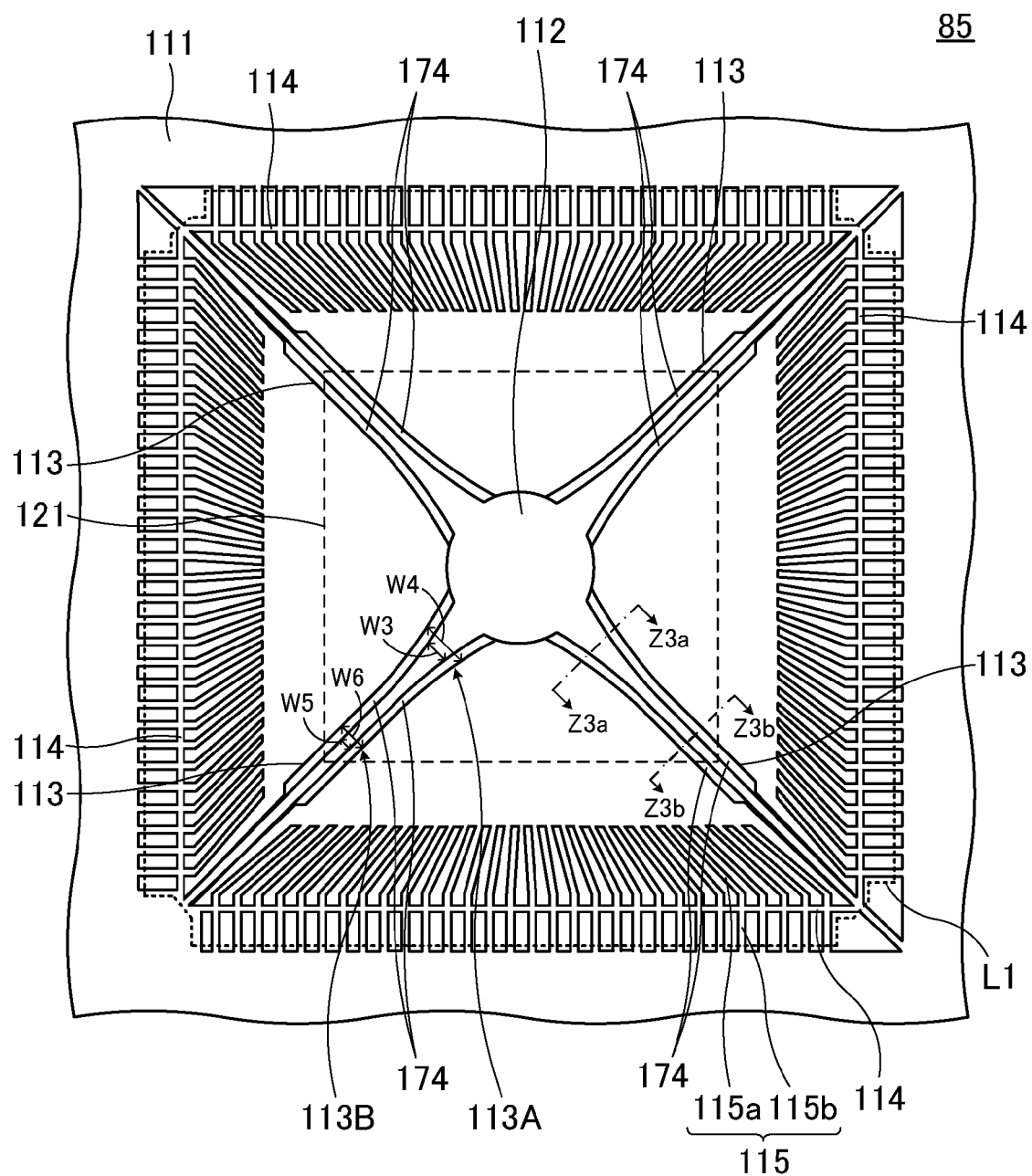
FIG. 6 is a top view schematically illustrating the structure of a lead frame according to a second embodiment.

FIG. 6 illustrates a lead frame 85 according to a second embodiment.

The lead frame 85 illustrated in FIG. 6 is formed by pressing a metal plate made of copper (Cu).

In FIG. 6, the lead frame 85 is viewed from the main mounting side thereof.

The illustrated lead frame 85 is employed for one resin-sealed semiconductor device.

The lead frame 85 has a frame portion 111 which has lead frames for other semiconductor devices (not illustrated).

The lead frame 85 includes a die pad (die stage) 112 and four hanging leads 113 which extend in different directions from the die pad 112. The lead frame further includes a plurality of lead terminals 115 arranged substantially on the same plane, between each pair of adjacent hanging leads 113. The lead terminals 115 are interconnected by dam bars (tie bars) 114.

The die pad 112 has a circular plane shape. The plane outside size of the die pad 112 is smaller than the outside size of a rectangular semiconductor element 121 indicated by dashed lines in FIG. 6.

The four hanging leads 113 extend generally toward the four corners of the semiconductor element 121, orthogonally to each other, on a plane parallel to the main surface of the die pad 112.

Figure 7A:
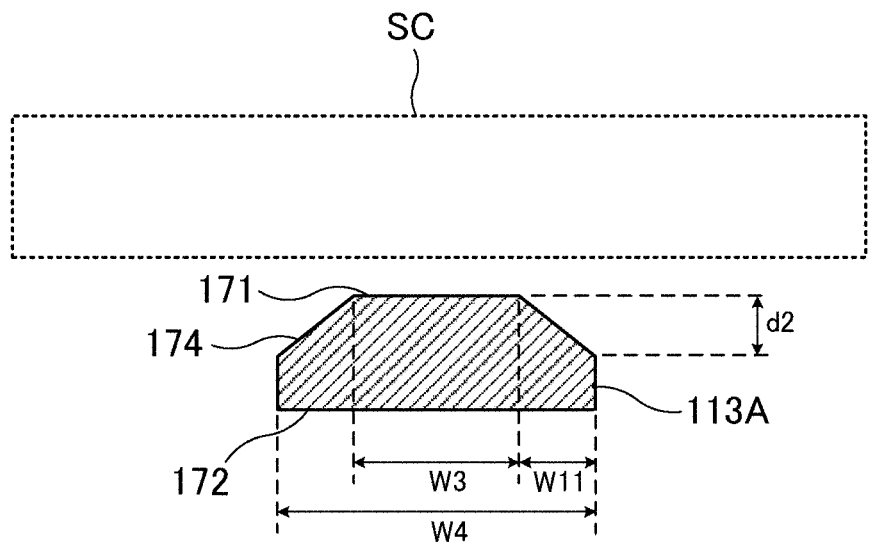
FIGS. 7A and 7B are cross-sectional views schematically illustrating the structure of a hanging lead of the lead frame according to the second embodiment.
Figure 7B:
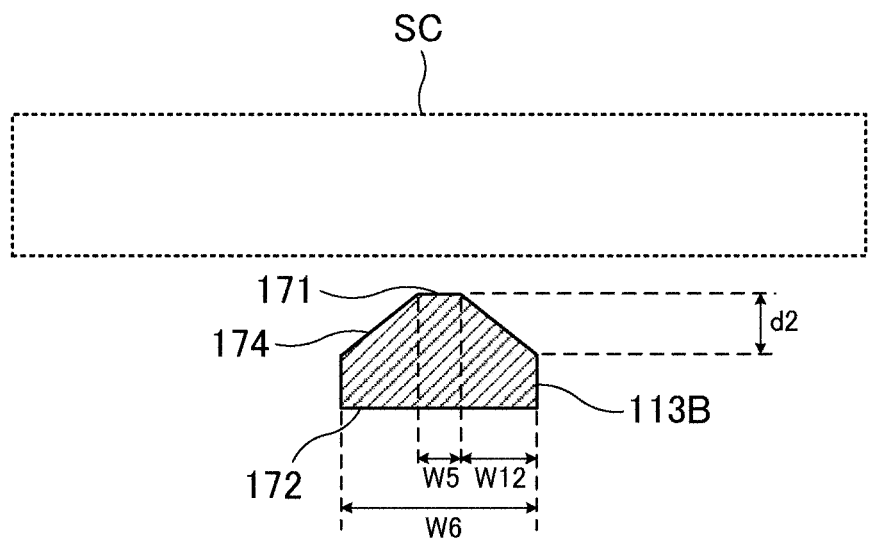

FIG. 7A is a cross-sectional view taken along the line Z3a-Z3a in FIG. 6. FIG. 7B is a cross-sectional view taken along the line Z3b-Z3b in FIG. 6. In FIGS. 7A and 7B, the semiconductor element 121 to be mounted over and fixed to the lead frame 85 is schematically indicated as the rectangle SC.

As illustrated in FIG. 6, each hanging lead 113 according to this embodiment has a portion 113A closer to the die pad 112, integrated with the die pad 112, and a portion 113B closer to the corresponding corner of the semiconductor element 121. The portion 113A and the portion 113B are different in width.

Specifically, the width of each hanging lead 113 becomes smaller gradually from the portion 113A toward the portion 113B.

The hanging lead 113 has a portion of a width W4 integrated with the die pad 112. The bottom main surface of this portion of the hanging lead 113 and the non-mounting surface of the die pad 112 share the same plane. The hanging lead 113 has also another portion of a width W6, closer to the corresponding corner of the semiconductor element 121. The width W4 is larger than the width W6.

In each hanging lead 113, the top surface of the portion 113A closer to die pad 112, integrated with the top surface of the die pad 112 has a width W3, and the top surface of the portion 113B closer to the corresponding corner of the semiconductor element 121 has a width W5. The width W3 is larger than the width W5.

Specifically, the width W3 is smaller than the width W4, and the width W5 is smaller than the width W6.

In the hanging lead 113, a linearly slanting portion 174 of a depth d2 is provided on both sides of each hanging lead 113, between the main surface thereof integrated with the mounting surface of the die pad 112 and the opposite bottom main surface.

The slanting portion 174 of the portion 113A, which is closer to the die pad 112 and is integrated with the top surface of the die pad 112, has a width W11 that is larger than a width W12 of the slanting portion 174 of the portion 113B, which is closer to the corresponding corner of the semiconductor element 121.

The portion 113A may be designed to be the same as or different from the portion 113B in width (W11, W12), inclination, and depth d2.

Figure 8A:
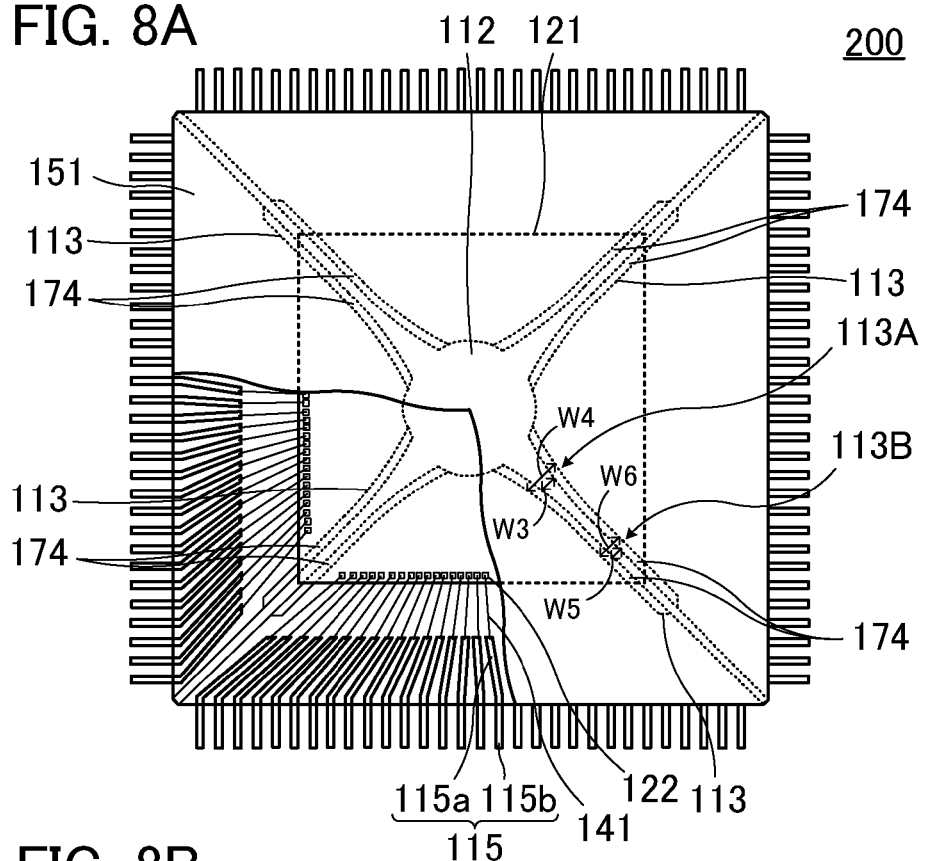
FIGS. 8A and 8B are top views schematically illustrating the structure of a semiconductor device according to the second embodiment.
Figure 8B:
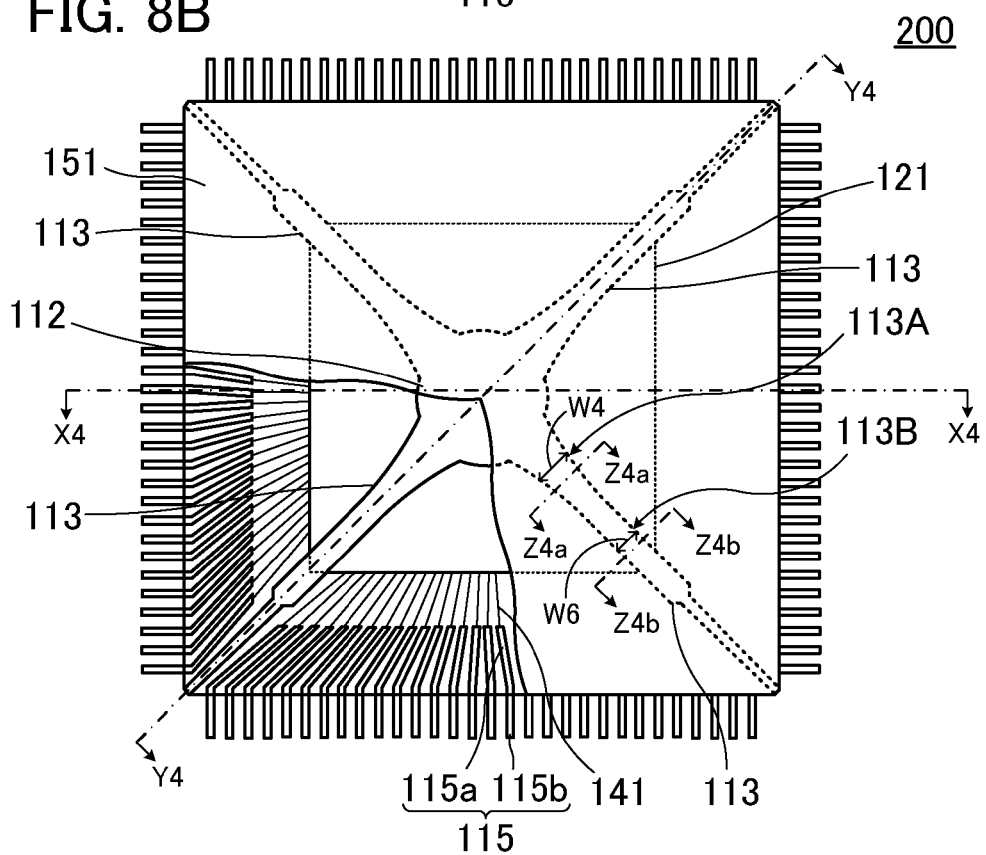

FIGS. 8A and 8B illustrate a semiconductor device 200 formed with the lead frame 85.

In FIG. 8A, the semiconductor device 200 is transparently viewed from the semiconductor element 121 side. In FIG. 8B, the semiconductor device 200 is transparently viewed from the die pad 112 side.

In FIGS. 8A and 8B, the sealing resin 151 is partially removed for convenience.

Figure 9A:
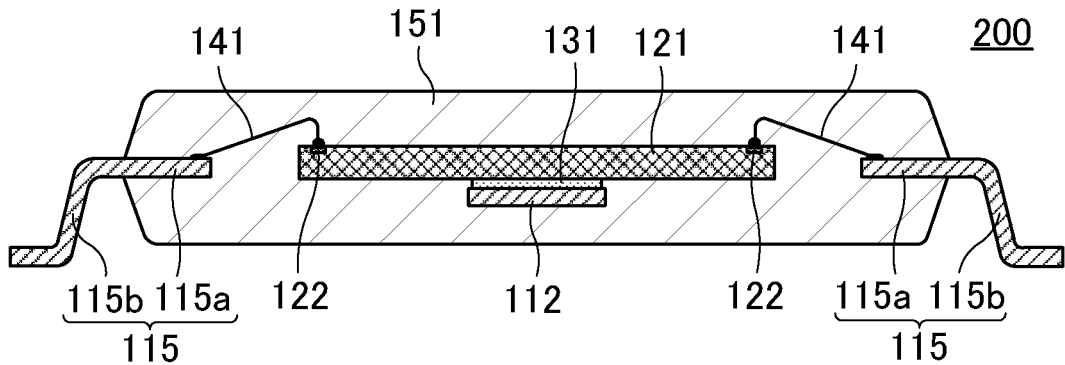
FIGS. 9A to 9D are cross-sectional views schematically illustrating the structure of the semiconductor device according to the second embodiment.
Figure 9B:
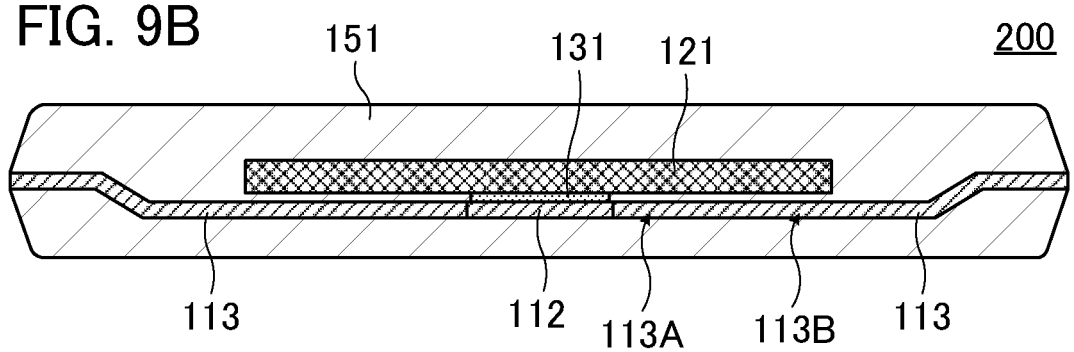
Figure 9C:
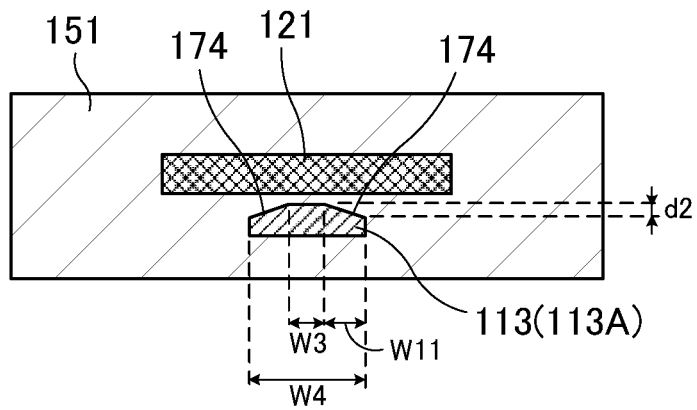
Figure 9D:
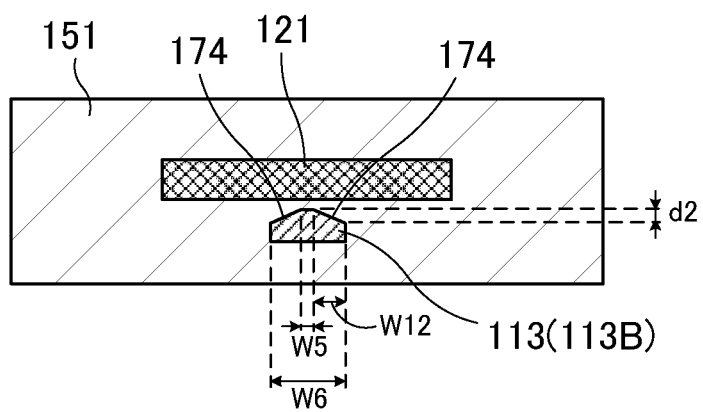
Figure 10:
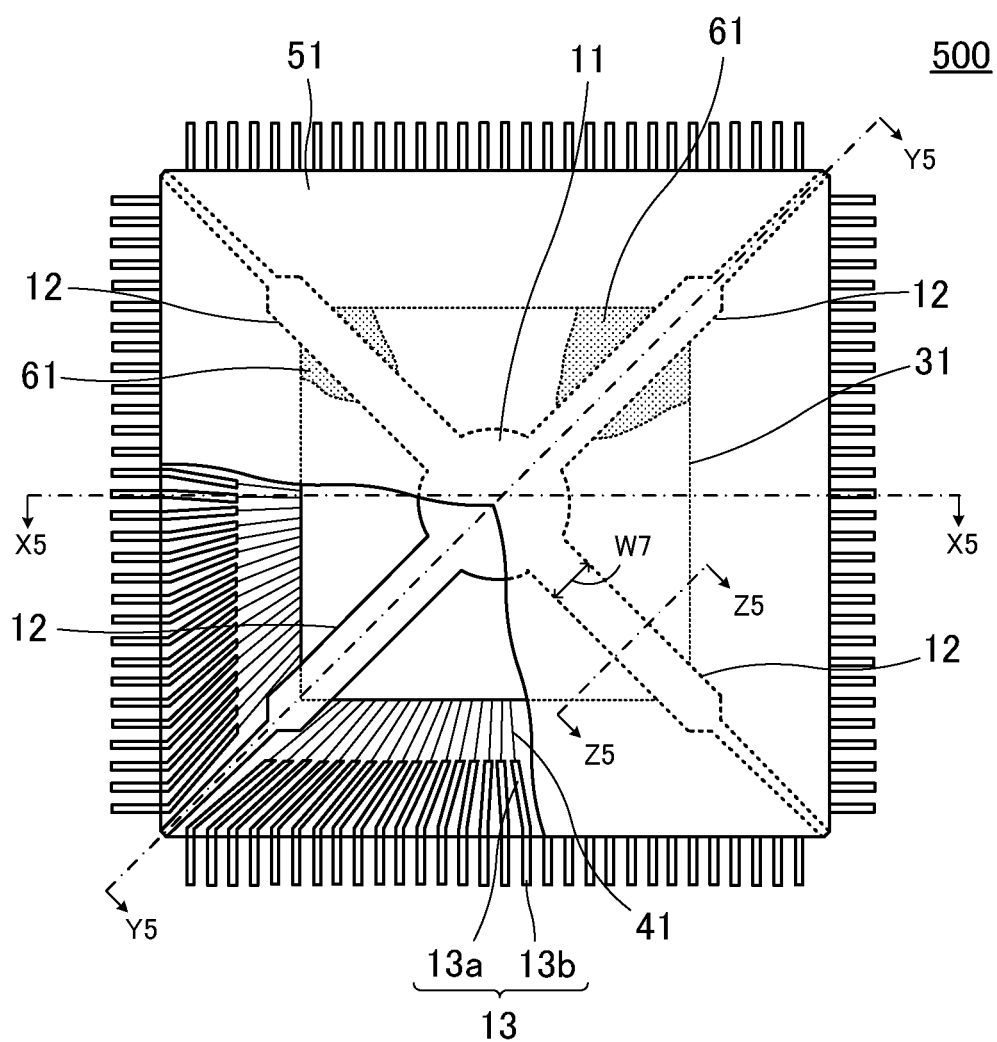
FIG. 10 is a top view schematically illustrating the structure of a first conventional semiconductor device.
Figure 11A:
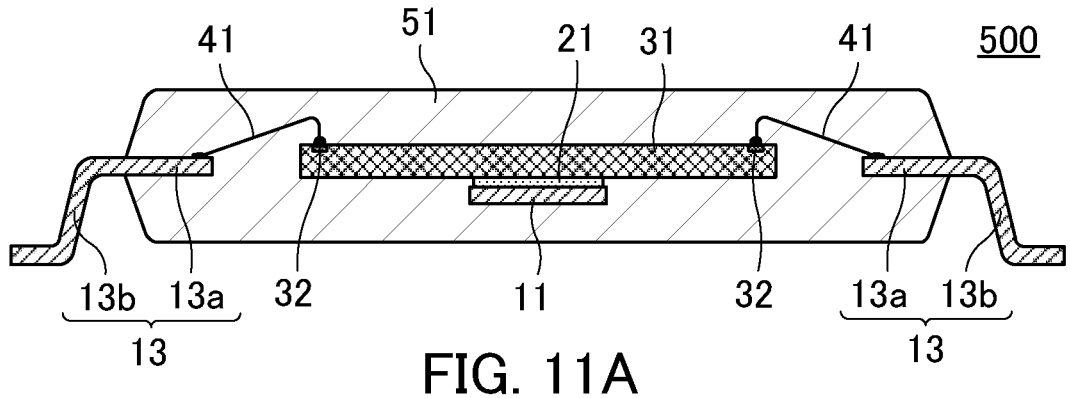
FIGS. 11A to 11C are cross-sectional views schematically illustrating the structure of the first conventional semiconductor device.
Figure 11B:
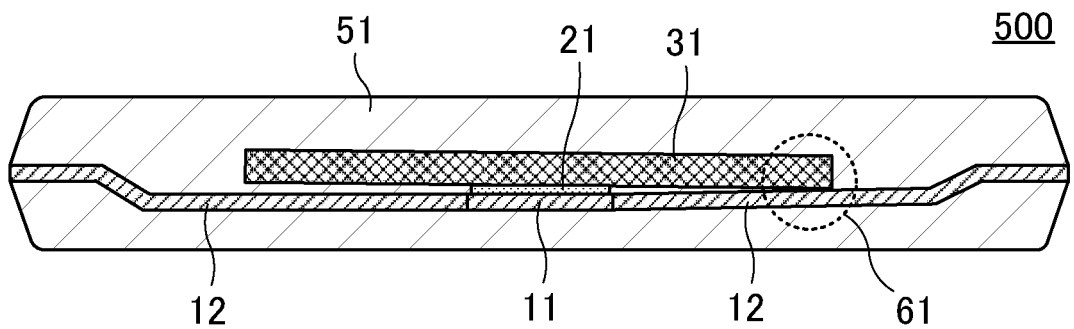
Figure 11C:
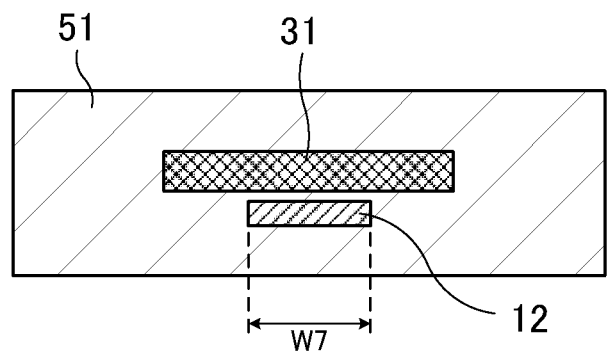
Figure 12:
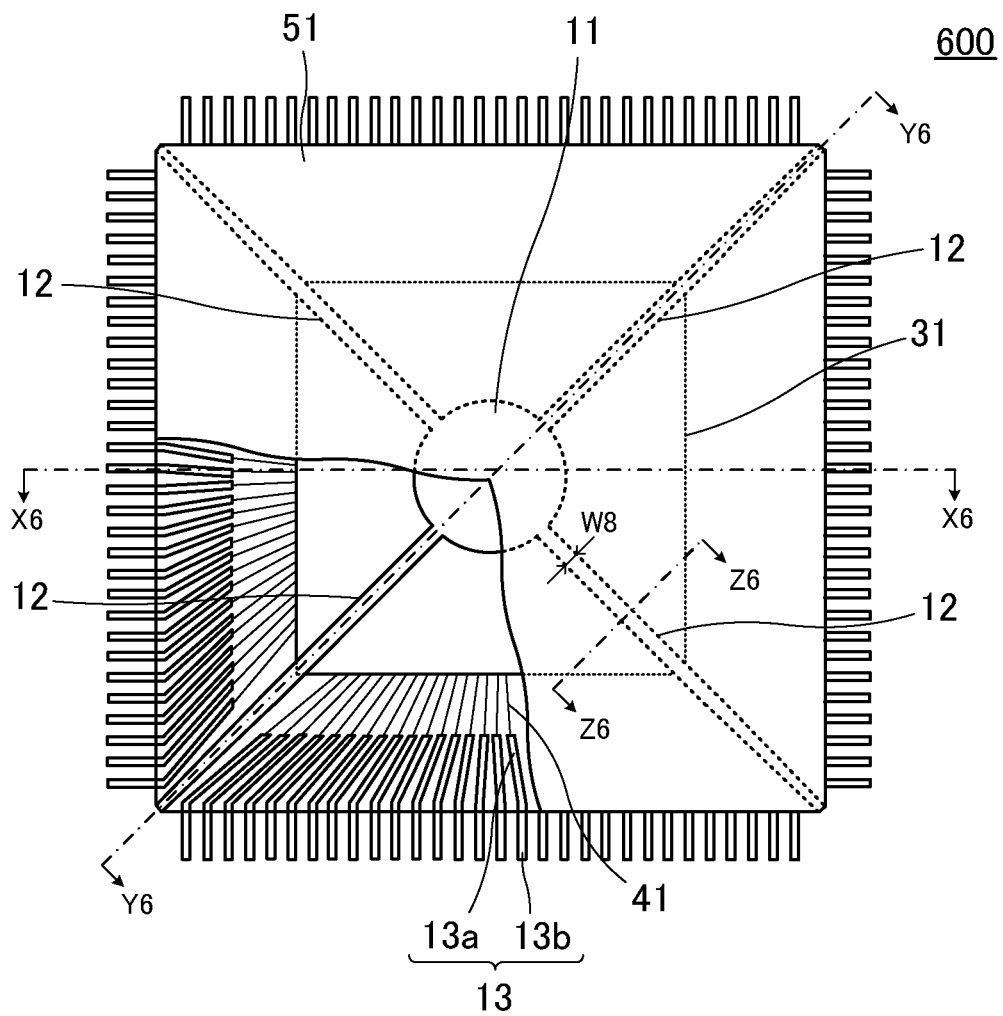
FIG. 12 is a top view schematically illustrating the structure of a second conventional semiconductor device.
Figure 13A:
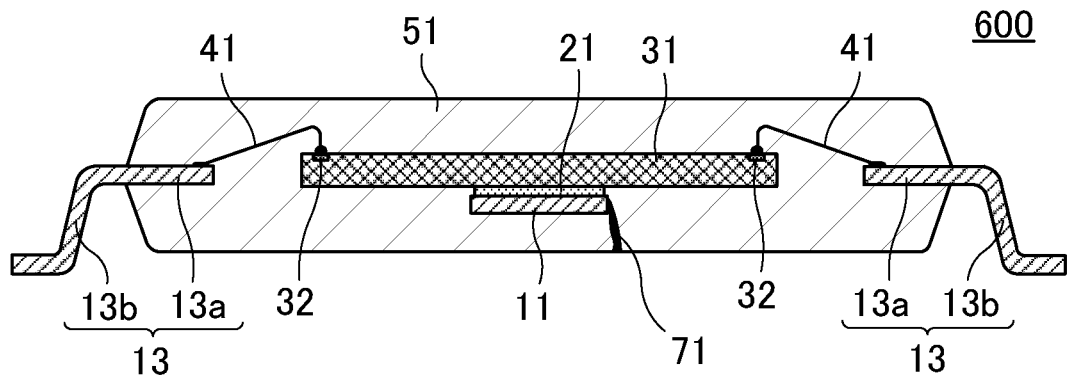
FIGS. 13A to 13C are cross-sectional views schematically illustrating the structure of the second conventional semiconductor device.
Figure 13B:
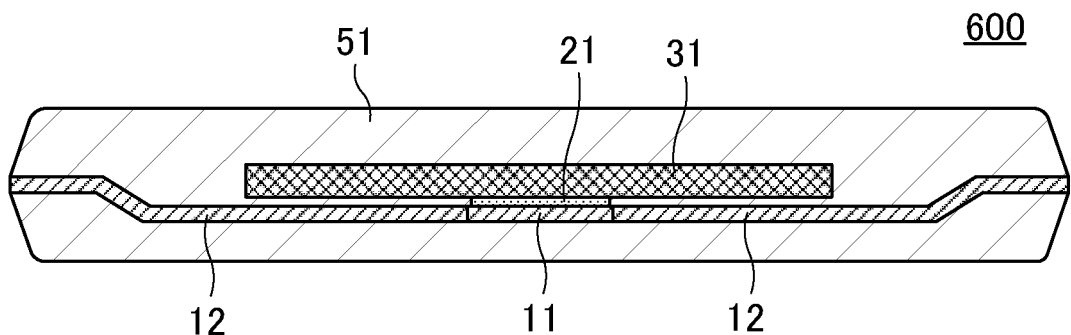
Figure 13C:
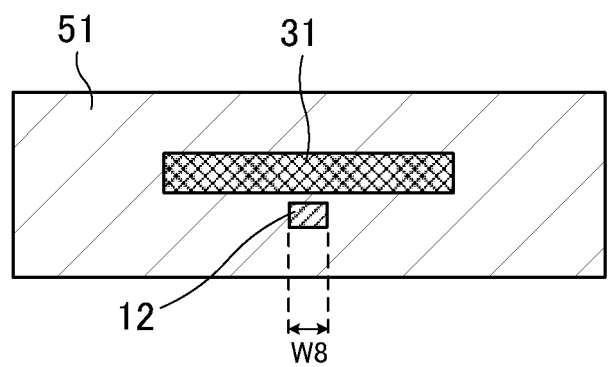

FIG. 9A is a cross-sectional view taken along the line X4-X4 in FIG. 8B. FIG. 9B is a cross-sectional view taken along the line Y4-Y4 in FIG. 8B. FIG. 9C is a cross-sectional view taken along the line Z4a-Z4a in FIG. 8B. FIG. 9D is a cross-sectional view taken along the line Z4b-Z4b in FIG. 8B Specifically, the semiconductor element 121 is mounted over and fixed to the die pad 112 with die-attaching material (die-bonding material) 131. The die pad 112 has a plane size smaller than the plane outside size of the semiconductor element 121 to be mounted thereon.

Each electrode terminal 122 of the semiconductor element 121 is connected to the corresponding inner lead 115a through the corresponding bonding wire 141.

The semiconductor element 121, each bonding wire 141, the die pad 112, the hanging leads 113, and the inner leads 115a are covered with the sealing resin 151.

The sealing resin 151 has a rectangular plane outside shape. A plurality of outer leads (terminal for external connection) 115b come out from the four sides of sealing resin 151.

In the semiconductor device 200, a clearance D of a thickness generally corresponding to the die-attaching material 131 is created by the die-attaching material 131 on the die pad (die stage) 112, between the top surface of the hanging lead 113 extending from the die pad 112 and the rear side of the semiconductor element 121.

Since having a larger width on the same plane as the bottom surface (rear side) of the die pad 112, the hanging lead 113 is superior in mechanical strength. As a result, the clearance D therebetween is maintained in an extending direction of the hanging lead 113.

Therefore, since the clearance D between the semiconductor element 121 and the hanging lead 113 is easily filled with the sealing resin 151, almost no portion is left unfilled with the sealing resin 151 in the clearance D.

At the same time, the gap between the slanting portion 174 of the hanging lead 113 and the rear side of the semiconductor element 121 is also filled with the sealing resin 151.

Specifically, the sealing resin 151 is applied onto the slanting portion 174 of the hanging lead 113 between the rear side of the semiconductor element 121 and the hanging lead 113, thereby providing a larger contact area between the rear side thereof and the sealing resin 151.

As a result, the semiconductor element 121 is firmly integrated with the sealing resin 151.

The size of the slanting portion 174 (widths W11 and W12, depth d2) is decided based on the material and the characteristics of the sealing resin 151.

Specifically, the size of the slanting portion 174 is selected in consideration of the viscosity of the sealing resin 151 and the diameter of filler contained in the sealing resin 151 (particle size) so that the resin component and the filler of the sealing resin 151 enter into the gap between the semiconductor element 121 and the slanting portion 174 of the hanging lead 113 in the resin sealing process.

As has been described above, in the semiconductor device 200 according to this embodiment, the widths W3 and W5 of the main surface of the hanging lead 113 integrated with the top mounting surface of the die pad 112, are smaller than the widths W4 and W6 of the opposite rear surface integrated with the non-mounting surface of the die pad 112.

In addition, since the width of each hanging lead 113 becomes smaller gradually from near the die pad 112 toward the corresponding corner of the semiconductor element 121, each area in the top surface of the hanging lead 13 where a corner of the semiconductor element 121 is placed is small.

Specifically, having the main surface of width W5, the hanging lead 113, even contacted with the semiconductor element 121, allows a very limited contact area.

Therefore, even if the moisture content in the sealing resin 151 is vaporized by heat application, the force expanding the contact interface between each hanging lead 113 and the semiconductor element 121 is suppressed, thereby preventing or reducing the occurance and expansion of the separation between the semiconductor element 121 and the sealing resin 151.

Specifically, in addition that the contact area becomes smaller, the separation is effectively prevented or suppressed by the firm covering by the sealing resin 151 except the contact area.

On the other hand, since the rear surface of the hanging lead 113 integrated with the non-mounting surface of the die pad 112 has the large width, the thermal stress in the sealing resin 151 is dispersed.

This prevents the stress from concentrating on the margin of the die pad 112, thereby preventing or suppressing the cracks which are likely to occur around the margin thereof in the sealing resin 151.

Specifically, also in this embodiment, the separation between the semiconductor element 121 and the sealing resin 151, and the crack occurance in the sealing resin 151 are prevented or suppressed effectively, thereby achieving a highly reliable resin-sealed semiconductor device.

In addition, each hanging lead 113 has almost the same thickness as the die pad 112 in the center of the hanging lead 113 in a width direction thereof. Therefore, the mechanical strength thereof is maintained.

Furthermore, the hanging leads 113 extend generally toward the four corners of the semiconductor element 121, orthogonally to each other, on a plane parallel to the main surface of the die pad 112. Therefore, the die pad 112 and the semiconductor element 121 placed on the die pad 112 are properly supported, without being slanted.

The linearly slanting portion 174 of the hanging lead 113 may be formed to have a different shape.

Specifically, the linearly slanting portion 174 may be formed like the lower-level portion or a double-sided arcuately slanting portion as described in the first embodiment.

In addition, the width of the linearly slanting portion 174 may become smaller gradually (step by step) from the portion integrated with the die pad 112 near the die pad 112, toward the portion near the corresponding corner of the semiconductor element 121.

The number of hanging leads 113 is not limited to four. The number of hanging leads 113 is selected depending on the structure of a necessary semiconductor device.

The lower-level portion of the hanging lead 113 may be provided as steps in a width direction of the hanging lead 113 or as a plurality of lines, as long as the flowability of the filler is ensured.

The lower-level portion or the slanting portion of the hanging lead 113 does not have to cover the entire length of the area where the hanging lead faces the semiconductor element.

As long as either one or both of the separation and the crack occurring in the semiconductor device are prevented or suppressed effectively, the lower-level portion or the slanting portion may be provided selectively in the area where the hanging lead faces the semiconductor element.

According to the disclosed semiconductor device, both the separation between structural members and the crack occurring in the resin-sealed portion are prevented or suppressed, thereby improving the semiconductor device both in quality and reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor device comprising:
   a semiconductor element having four corners;
   a lead frame that includes a die pad having a mounting surface over which the semiconductor element is mounted, and a plurality of hanging leads extending from the die pad in four directions, the die pad having an area smaller than an area of the semiconductor element, each of the hanging leads including a first part which is entirely located under the semiconductor element, the first part having a first portion on a same plane as the mounting surface and a second portion opposite to the first portion, a part of each of the hanging leads being located under a respective one of the four corners; and
   resin that seals the semiconductor element, the die pad, and the hanging leads,
   wherein a width of the first portion is smaller than a width of the second portion.

2. The semiconductor device according to claim 1, wherein a level difference is provided on both sides of the hanging lead between the first portion and the second portion.

3. The semiconductor device according to claim 1, wherein a linear slope is provided on both sides of the hanging lead between the first portion and the second portion.

4. The semiconductor device according to claim 1, wherein an arcuate slope is provided on both sides of the hanging lead between the first portion and the second portion.

5. The semiconductor device according to claim 1, wherein a width of the hanging lead becomes smaller in a direction extending from the die pad.

6. The semiconductor device according to claim 1, wherein the semiconductor element is mounted over the die pad with a connecting member therebetween.

7. The semiconductor device according to claim 1, wherein:
   the lead frame includes a plurality of leads including outer leads and inner leads, and
   the semiconductor element has electrode pads electrically connected to the inner leads through wires.

8. A lead frame comprising:
a die pad over which a semiconductor element having four corners is to be mounted and which has an area smaller than an area of the semiconductor element; and
a plurality of hanging leads extending from the die pad in four directions, each of the hanging leads including a first part which is entirely located under the semiconductor element, the first part having a first portion on a same plane as the mounting surface and a second portion opposite to the first portion, wherein
a width of the first portion is smaller than a width of the second portion, and
a part of each of the hanging leads is located under a respective one of the four corners.

9. The lead frame according to claim 8, wherein a level difference is provided on both sides of the hanging lead between the first portion and the second portion.

10. The lead frame according to claim 8, wherein a linear slope is provided on both sides of the hanging lead between the first portion and the second portion.

11. The lead frame according to claim 8, wherein an arcuate slope is provided on both sides of the hanging lead between the first portion and the second portion.

12. The lead frame according to claim 8, wherein a width of the hanging lead becomes smaller in a direction extending from the die pad.

13. The semiconductor device according to claim 1, wherein an area of the whole of the die pad is smaller than an area of the whole of the semiconductor element.

14. The lead frame according to claim 8, wherein an area of the whole of the die pad is smaller than an area of the whole of the semiconductor element.

* * * * *